(12) United States Patent
Peake et al.

(10) Patent No.: US 6,677,642 B2
(45) Date of Patent: Jan. 13, 2004

(54) FIELD EFFECT TRANSISTOR STRUCTURE AND METHOD OF MANUFACTURE

(75) Inventors: Steven T. Peake, Warrington (GB); Raymond J. Grover, Didsbury (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/099,683

(22) Filed: Mar. 15, 2002

(65) Prior Publication Data
US 2002/0137318 A1 Sep. 26, 2002

(30) Foreign Application Priority Data
Mar. 23, 2001 (GB) .............................. 0107408

(51) Int. Cl.[7] .............................................. H01L 29/76
(52) U.S. Cl. .................... 257/335; 257/492; 257/493
(58) Field of Search ................. 257/335, 336, 257/337, 338, 339, 340, 341, 342, 343, 491, 492, 493, 487

(56) References Cited
U.S. PATENT DOCUMENTS

| | | | |
|---|---|---|---|
| 4,810,664 A | * | 3/1989 | Kamins et al. |
| 4,922,327 A | * | 5/1990 | Mena et al. |
| 5,300,448 A | | 4/1994 | Merchant et al. ............. 437/41 |
| 5,304,827 A | * | 4/1994 | Malhi et al. |
| 5,412,241 A | | 5/1995 | Merchant .................... 257/409 |
| 5,932,897 A | * | 8/1999 | Kawaguchi et al. |
| 6,025,237 A | * | 2/2000 | Choi |
| 6,348,716 B1 | * | 2/2002 | Yun |

* cited by examiner

*Primary Examiner*—Nathan J. Flynn
*Assistant Examiner*—Kevin Quinto
(74) *Attorney, Agent, or Firm*—Aaron Waxler

(57) ABSTRACT

A field effect transistor structure is formed with a body semiconductor layer (5) having source (9), body (7), drift region and drain (11). An upper semiconductor layer (21) is separated from the body by an oxide layer (17). The upper semiconductor layer (21) is doped to have a gate region (23) arranged over the body (7), a field plate region (25) arranged over the drift region 13 and at least one p-n junction (26) forming at least one diode between the field plate region (25) and the gate region (23). A source contact (39) is connected to both the source (9) and the field plate region (25).

6 Claims, 6 Drawing Sheets

FIELD EFFECT TRANSISTOR STRUCTURE AND METHOD OF MANUFACTURE

The invention relates to an insulated gate field effect transistor structure and further to a method of manufacturing such a structure.

In an insulated gate field effect transistor (IGFET) structure, a semiconductor channel region between source and drain is controlled by a gate insulated from the channel. IGFET structures are generally implemented as Metal Oxide Semiconductor (MOS) structures.

A double diffused MOS (DMOS) structure may be used in which a long lateral path, known as the drift region, extends between drain and source diffusions. The drift region attenuates any high voltages applied between drain and source down to around 20 in the channel region controlled by the gate.

In order to maximise the voltage capability of the transistor, the drift region would ideally be long and or lightly doped. Unfortunately, these properties would mean that the drift region would contribute a relatively high resistance to the overall device when the transistor is on. To address this, it is known to dope the drift region with an appropriate doping profile and to choose its thickness such that the reversed bias junctions between the MOSFET channel and source and between the channel and the substrate deplete the entire drift region of charge carriers when the device is turned off. This creates a uniform electric field in the drift region when a large voltage is applied across the transistor when switched off, which maximises the breakdown voltage since there are no peaks in the electric field to initiate premature avalanche breakdown. The fully depleted drift region is said to be in a RESURF (reduced surface field) condition. In a RESURF structure, the full thickness of the drift region is depleted when the device is turned off.

A lateral MOS device using this technique is described in U.S. Pat. No. 5,412,241 to Merchant, assigned to Philips Electronics North America Corp. The device is illustrated in FIG. 1.

The device is a silicon on insulator (SOI) device having a layer of silicon 101 formed on a buried oxide layer 103 on a semiconductor substrate 105. Source 107 and drain 109 regions are formed in the silicon, and connected to source 108 and drain 110 contacts respectively.

A gate layer 111 is provided over part of the silicon layer 101 which forms a channel, separated from the channel by a gate oxide 112. The gate layer is connected to a gate contact 113. The gate controls conduction between source 107 and drain 109, as is well known.

Between the channel and the drain a drift region 119 is provided in the silicon layer 101 to allow large voltages (e.g. 100V or more) to be applied between source and drain. A large voltage applied across source and drain may be at least partially dropped in the drift region thus reducing the voltage dropped in the channel.

A field plate 115 is formed integrally with the gate layer 111 over the LOCOS oxide layer 114 and extends laterally over the drift region 119 in the silicon layer 101. When the device is turned off, the field plate depletes the drift region to provide a RESURF effect.

The drift region 119 is protected from the effects of an impinging electric field, such as may be caused by moisture or other charged contaminants on the surface of the wafer, by the field plate 115. Electric fields will terminate on the field plate 115.

Further, because the field plate is connected to the gate the drift region 119 may be depleted from the top which means that the device can be designed with a higher doping level in the drift region than would otherwise be possible. This means that the device of U.S. Pat. No. 5,412,241 can be made with a low on-resistance.

Such silicon on insulator device structures exhibit, by virtue of their structure, low values of the capacitance between gate and drain ($C_{gd}$) and the charge needed to be supplied through gate and drain to switch the device ($Q_{gd}$). These low values of $C_{gd}$ and $Q_{gd}$ give rise to rapid switching, i.e. a rapid response to changes in gate voltage.

However, there remains a need for fast switching, both in SOI devices and in other IGFET types.

IGFET devices are highly sensitive to excessive voltages. If too high a voltage is present between the gate and the channel the gate insulator may break down and destroy the device. Such high voltages may simply be present in the circuit in which the IGFET device is mounted or alternatively the voltage may be electrostatic. It is accordingly highly beneficial to provide suitable protection for the gate, known as electrostatic discharge protection.

According to the invention there is provided a field effect transistor structure comprising: a source and a drain laterally spaced in a body semiconductor layer; a channel and a drift region in the body semiconductor layer between the source and the drain; an oxide layer over the channel and the drift region; an upper semiconductor layer arranged over the oxide layer, wherein the upper semiconductor layer is doped to have a gate region arranged over the channel, a field plate region arranged over the drift region and at least one p-n junction forming at least one diode between the field plate region and the gate electrode region; and an electrical interconnection between the source region and the field plate to electrically connect the source region and the field plate.

The transistor structure thus provides at least one electrostatic protection diode in a simple structure that is convenient to manufacture. The diode or diodes provided in the structure according to the invention protect the gate from electrostatic discharge by virtue of Zener action. If too high a voltage is present between gate and source, the diode or diodes undergo reverse breakdown to allow current to flow between gate and source.

Moreover, the source-connected field plate acts as a Faraday screen between gate and drain so reducing $C_{gd}$ and hence the charge needed to be applied through gate and drain. This decreases the switching time.

In contrast, the gate-connected field plate of U.S. Pat. No. 5,412,241 allows the drift region to be depleted by a suitable voltage on the gate and hence on the field plate. This prior art arrangement will normally increase $C_{gd}$ rather than reduce it as in the present invention. Accordingly, the prior art arrangement will tend to increase switching time.

There is no need for fine patterning of the upper semiconductor layer itself, since it is the dopant masks that define the regions of the layer that form the field plate, gate electrode and diodes. It is also not necessary to form separate field plate and gate electrode layers, which might at first sight be thought necessary if a field plate not connected to the gate electrode were to be required. These features simplify manufacture.

The transistor structure is preferably formed to have a source and drain of a first conductivity type. The drift region may be of the same conductivity type but of lower doping, and the channel may be formed in a body region of opposite conductivity type. The first conductivity type may be n-type.

The p and n regions of the upper semiconductor layer preferably alternate to form at least one diode.

At least one pair of back to back diodes may be provided in the upper semiconductor layer between the gate and the field plate.

A plurality of back to back diodes may be provided to increase the maximum voltage between source and gate before breakdown occurs.

At first sight, it might appear that the increase in gate-source capacitance $C_{gs}$ would counteract any benefit of the reduced $C_{gd}$. However, this is not generally the case. In conventional circuit arrangements, the Miller effect comes into play. The total input capacitance $C_{input}$ is given by the sum of $C_{gs}$ and the Miller capacitance, $C_{M=(1+g_M R_L)}C_{gd}$, where $R_L$ is the load resistance and $g_m$ the transconductance. This means that the switching speed may be dominated by the contribution from $C_{gd}$ so that the device according to the invention generally has an improved switching speed.

The upper semiconductor layer including the gate electrode and the field plate may be fabricated from any convenient semiconducting material, such as polysilicon. The field plate may be doped n+or p+.

The drift region may be linearly graded, i.e. it may have a concentration of dopant that varies linearly decreasing away from the drain. This may result in an improved breakdown performance compared with a drift region of constant concentration.

The invention may be implemented in a SOI structure, with a substrate, a buried oxide layer on the substrate and the body semiconductor layer deposited on the buried oxide layer. Source, drain, channel and drift regions may be formed from implantations in the deposited body semiconductor layer. Such SOI structures offer advantages, such as intrinsically lower capacitance.

The oxide layer may include a LOCOS layer above the drift region and a gate oxide layer above the channel.

Preferably, the doping concentrations are such that the depletion region spreads throughout the drift region when the transistor is turned off, that is to say the transistor is a reduced surface field (RESURF) transistor. The depletion region may extend into the body and drain.

The invention also relates to method of manufacturing a field effect transistor including, in any order, the steps of: forming an oxide layer over a semiconductor body layer; depositing an upper semiconductor layer over the oxide layer; diffusing alternating p and n regions in the upper semiconductor layer to form a gate region, a field plate region and at least one p-n junction forming at least one diode between the field plate region and the gate region; diffusing source and drain diffusions to form source and drain in the semiconductor body layer; and depositing a metallisation layer defining a source contact connected to the source region and to the field plate region, a gate contact connected to the gate region and a drain contact connected to the drain region.

The method accordingly provides a simple method of manufacturing a semiconductor transistor structure with integral electrostatic discharge protection and a source-connected field plate.

The oxide layer over the drift region may be formed by local oxidation of silicon.

Embodiments of the invention will now be described, purely by way of example, with reference to the accompanying drawings, in which.

It should be noted that all the figures are diagrammatic, and not to scale. The same reference numerals are generally used to refer to corresponding or similar features in different or modified embodiments.

Figure 1:
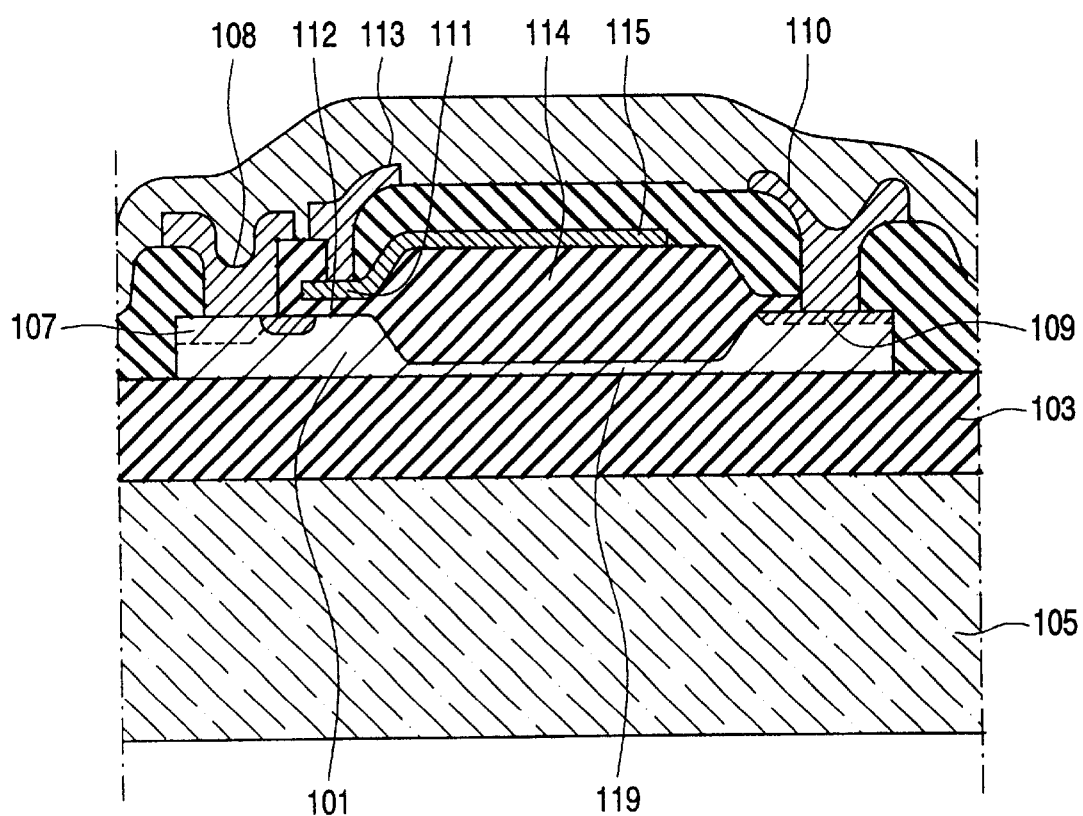
FIG. 1 shows a prior art RESURF device.
Figure 2:
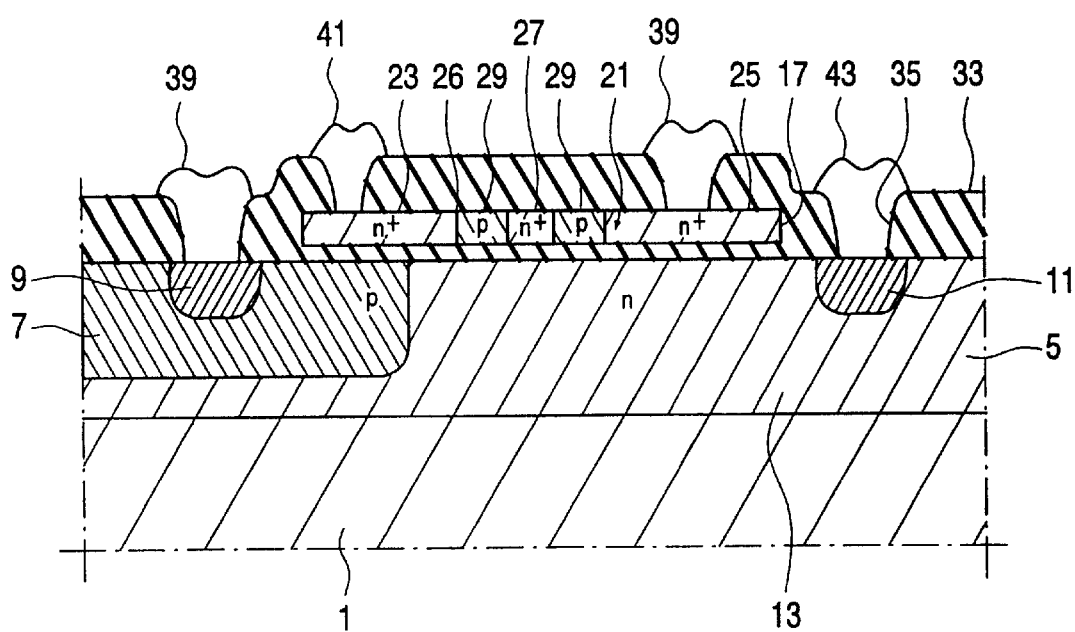
FIG. 2 is a schematic drawing of a first exemplary embodiment of the invention.

Referring to FIG. 2, a source 9 and drain 11 are formed in a semiconductor layer 5 on a semiconductor substrate 1. Between the source and drain there is a body 7 and a drift region 13. An oxide layer 17 covers a part of the body 7 which forms the channel of the transistor. The oxide layer 17 likewise covers the drift region 13. A polysilicon layer 21 is doped to have a gate region 23 highly doped with a first conductivity type over the channel part of the body 7. The polysilicon layer is doped to have a field plate region 25 highly doped with the same conductivity type over the drift region. The polysilicon layer is also patterned to have alternating p and n regions 27, 29 forming at least one p-n junction 26 between the field plate region and the gate region. In the example shown in the drawings, two pairs of back-to-back p-n junctions, 26, i.e. back to back diodes, are provided.

An oxide layer 33 covers the structure and contacts are made to the source 9, drain 11, gate 23 and field plate 25 through vias 33 in the oxide layer 33. A source contact 39 connects to both the source 9 and the field plate 25, a drain contact 43 connects to the drain 11 and a gate contact 41 to the gate 23.

In use, the source-connected field plate 25 acts as a shield between the gate electrode 23 and the drain 11. This shield reduces the capacitance $C_{gd}$ between the gate electrode 23 and the drain 11. Accordingly, the charge $Q_{gd}$ that needs to be delivered to develop a given voltage between the gate electrode 23 and the drain 11 is likewise reduced. This greatly increases the switching speed of the device and so increases the frequency response of the device.

In conventional circuit arrangements, the input capacitance at the gate electrode 23 is the sum of the gate-source capacitance $C_{gs}$ and the Miller capacitance, $C_M=(1+g_M R_L)C_{gd}$, where $R_L$ is the load resistance and $g_m$ the transconductance. This means that the switching speed is dominated by the contribution from $C_{gd}$ so that the device according to the invention has an improved switching speed, in spite of any increase the gate source capacitance $C_9$, caused by capacitance between the field plate 21 and the gate electrode 23.

The structure in addition has a plurality of pairs of back to back diodes 26 formed from alternating p and n regions 29, 27 in the semiconductor layer 21 between the gate electrode 23 and the source-connected field plate 25, or more precisely formed from the p-n junctions between these regions. The diodes act as protection diodes. In the embodiment shown, the diodes each have Zener breakdown voltages of 7V so the two pairs can support up to 14V in each direction. Accordingly, the gate is protected from voltages above 14V.

The source connected field plate 25 may, when the device is switched off, cause depletion of the drift region 13. Complete depletion of the drift region 13 means that the device has a reduced surface field (RESURF) so that a higher voltage may be applied between source 9 and drain 11 without having too high a field at some part of the drift region 13 which would cause avalanche breakdown.

A further feature of the invention is that the backside of the substrate 1 may be biased at source potential to assist in switching the device off. The drift region 13 will be depleted; the depletion region extending to the n+drain 11. A backside contact (not shown) may be provided on the rear of the substrate to provide a connection to the substrate 33 for supplying the biasing voltage at source potential.

The structure disclosed may deliver low on-state resistance in addition to the quick switching and high breakdown voltage discussed above.

Further, the structure described can be manufactured with little increase in process complexity compared with existing structures. Indeed, no additional mask steps are required in embodiments in which the field plate 17 is formed from the same material as the gate electrode 15. Only one additional mask step is required for embodiments in which the field plate 17 is formed from a different material to the gate electrode 15.

As those skilled in the art will appreciate it is also possible, in a modification of the invention, to provide a p-channel device, by providing an n-type doped channel region 7 and p type source 3 and drain 5.

The manufacture of a second embodiment of a device according to the invention, using a silicon-on-insulator (SOI) structure, will now be described with reference to FIG. 3.

Figure 3A:
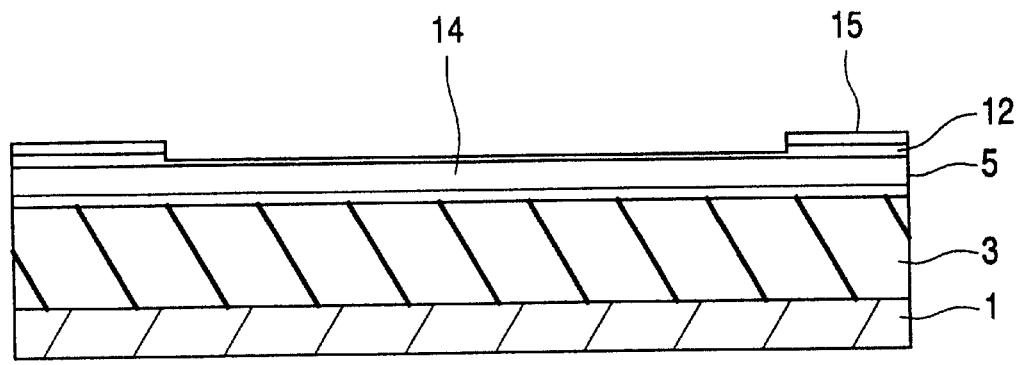
FIG. 3 illustrates a second exemplary embodiment of a transistor structure in accordance with the invention and its manufacture.

Referring to FIG. 3a, the first step in the manufacture of a device according to the second embodiment of the invention is to form a buried oxide layer 3 and a silicon layer 5 on a semiconductor substrate 1. This is done by bonding a silicon wafer on a silicon substrate 1 and thinning the wafer to form the silicon layer 5. Oxide layers on the face of the silicon substrate 1 and the silicon layer 5 placed face to face form the buried oxide layer 3.

Alternatively other techniques for forming the buried layer structure may be used, for example by depositing or growing an oxide layer 3 followed by a silicon layer 5.

Next a thin screen oxide layer 12 is grown, to a target thickness of 550 Å. Then, an initial implant is performed, which provides background phosphorous doping in the upper part 14 of the silicon layer. The doping is carried out to a dose of $1.4 \times 10^{12}$ cm$^{-2}$ and the implantation is carried out at 160 keV.

Then, a 1400 Å thick LPCVD nitride layer 15 is deposited directly onto the screen oxide layer 12. This has two functions—it provides the mask for the subsequent LOCOS oxidation and further provides an additional screen for the subsequent n-well implant.

Following deposition, the LPCVD layer is patterned using photolithography and dry etching. Some erosion of the underlying screen oxide layer occurs in the dry etching step, which results in the structure shown in FIG. 3a. Therefore, the original screen oxide layer is removed with a dip etch in 7:1 HF and new screen oxide layer 12 grown to the same thickness as before.

Figure 3B:
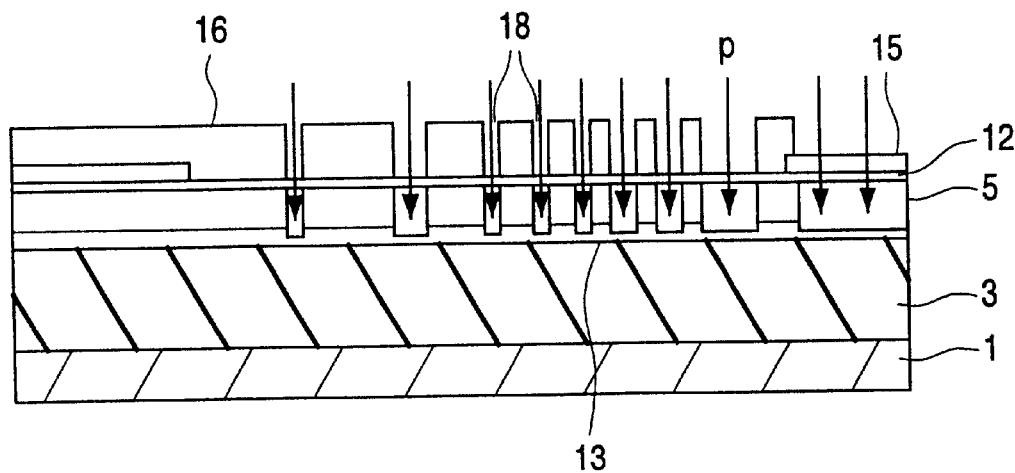
Figure 3C:
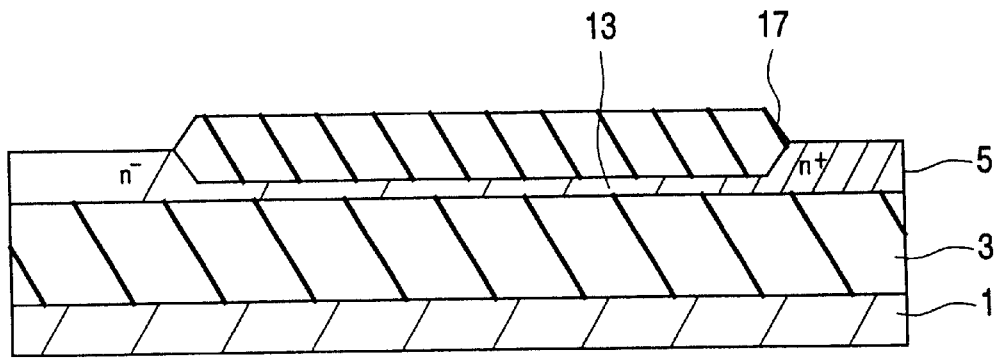

A graded drift region 13 is then formed in the silicon layer 5 (FIG. 3b). The formation of this graded drift region 13 is carried out as described in U.S. Pat. No. 5,300,448 issued 5 Apr. 1994. In this process, a mask 16 is patterned and to have a plurality of openings 18 of different sizes. Phosphorous is then implanted to dope the silicon with a laterally varying dopant concentration. An annealing step is carried out to obtain a substantially uniform gradient of doping level in the graded drift region 13.

A local oxidation on silicon (LOCOS) process is carried out to thin the graded drift region 13 and to grow a LOCOS oxide layer 17 above the drift region. Firstly, an acid preclean is performed, and then the LOCOS layer 17 is grown by oxidation of the silicon layer 5 where that layer is exposed. This consumes 1 μm of silicon, and produces 2.2 μm of oxide. The nitride layer 15 functions as the LOCOS mask.

The nitride layer 15 is then removed by a wet etch, to remove any surface oxynitride, followed by a dry etch. Then, the screen oxide layer 12 is removed by a 30 s dip etch, to arrive at the structure of FIG. 3c.

The surface is not at this stage suitable for gate oxidation because of the "birds beak" effect at the edge of the LOCOS silicon. Thus, the surface of the silicon layer 5 is removed by sacrificial oxidation followed by a 45 second 7:1 HF dip etch.

Figure 3D:
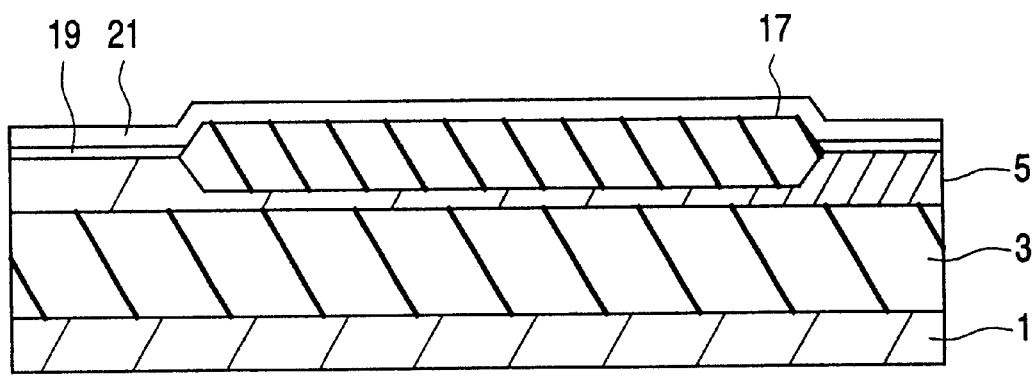

A thin gate oxide layer 19 of target thickness 800 Å is then grown over the p-type body 7 and the end of the drift region. A polysilicon layer 21 is then formed to a thickness of 11 250 Å over the gate oxide layer 19 and the LOCOS layer 17 (FIG. 3d).

Figure 3E:
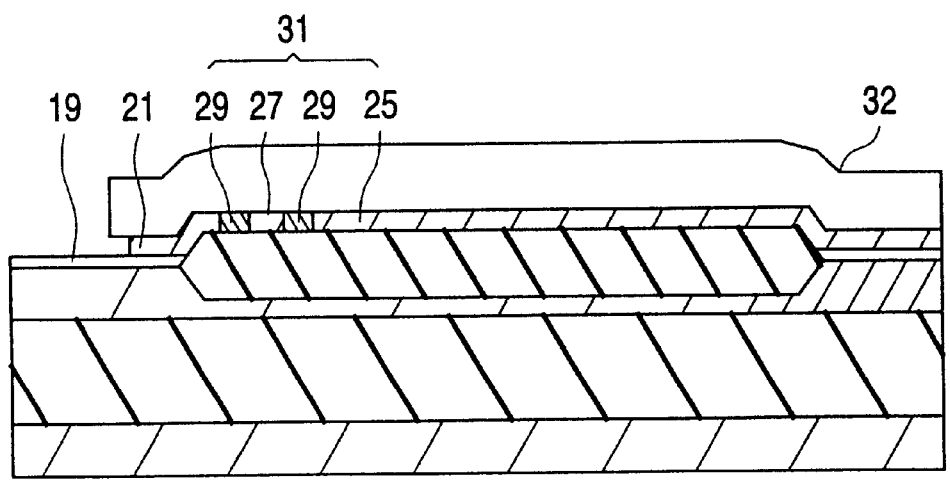

The polysilicon layer 21 is then doped with in alternating bands of n and p type by implantation. An n-type gate electrode 23 is formed over the gate oxide layer and an n-p type field plate 25 is formed over the graded drift region 13. Between the gate electrode 23 and field plate 25 a plurality of alternating n-type strips 27 and p-type strips 29 form a plurality of back-to back diodes 31 (FIG. 3e).

Next, a 2 μm thick resist layer 32 is formed, and patterned to leave the source region clear of resist, whilst protecting the rest of the structure. A two stage etch process removes the material above the source region. Firstly, a vertical dry etch is performed to etch to the top of the gate oxide, followed by an over etch which removes resist from below the edge of the mask with an undercut of 2 μm.

Figure 3F:
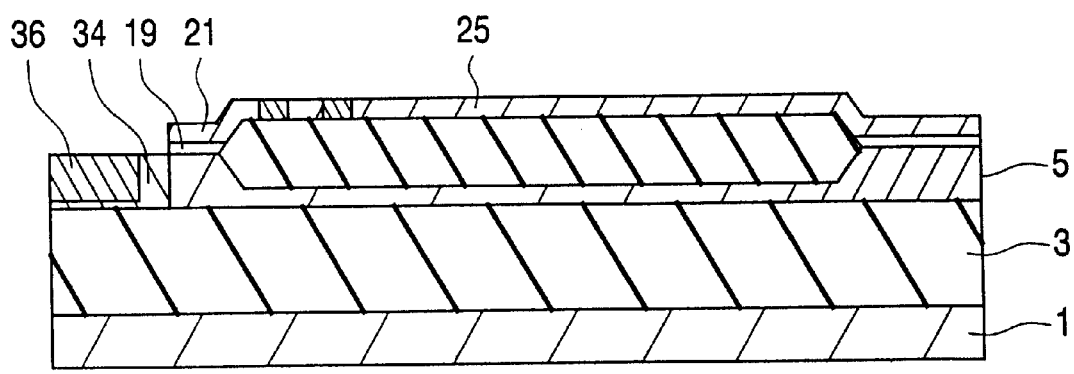
Figure 3G:
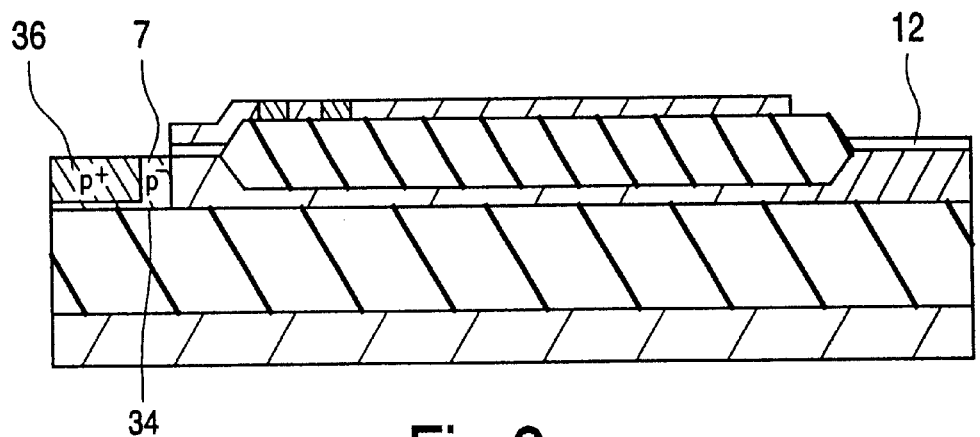

An ADP implant is then performed to provide a high doping density body region 36 (FIG. 3f). The resist is then stripped, and a low doping density body implant 34 performed. The low doping density implant forms the lightly doped p body implant self aligned to the edge of the gate polysilicon. Next, the gate oxide layer 19 is stripped from the source region.

A p-body anneal diffuses the dopant atoms from the lightly p-doped body under the polysilicon gate to form the channel 7. In this step, a screen oxide layer 12 is also grown on the source region.

A dry etch process using a photolithographically defined mask removes the polysilicon layer 21 where not required. The mask in particular removes polysilicon from the drain region. However, since the source region is already patterned, the mask covers the source region during this step. A screen oxide layer 12 is then grown on the exposed drain region.

Figure 3H:
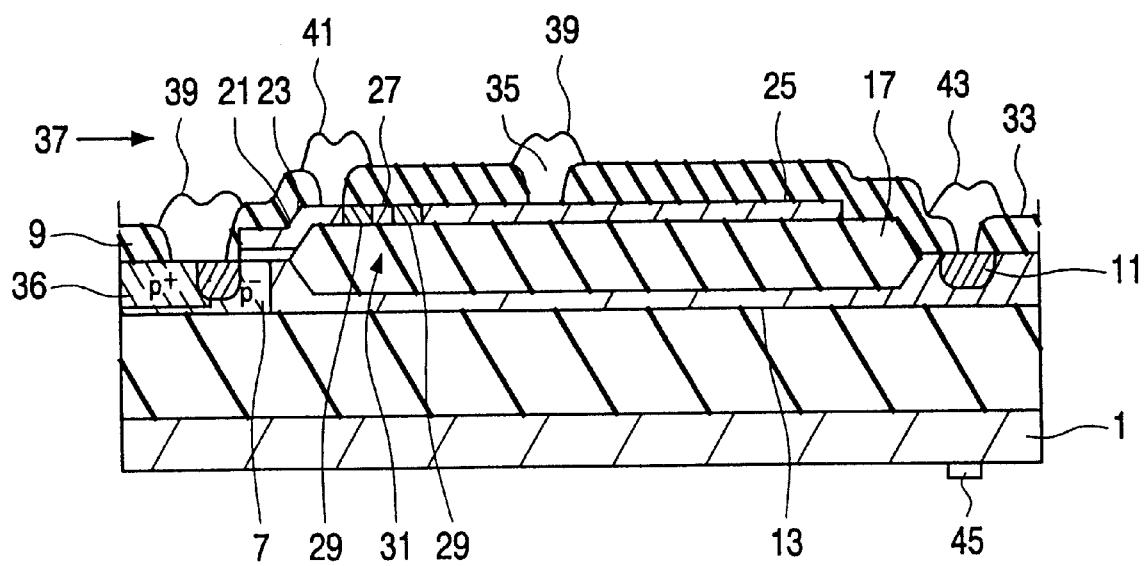

Referring to FIG. 3h, a further n+diffusion is then performed to define the source and drain regions.

Figure 4:
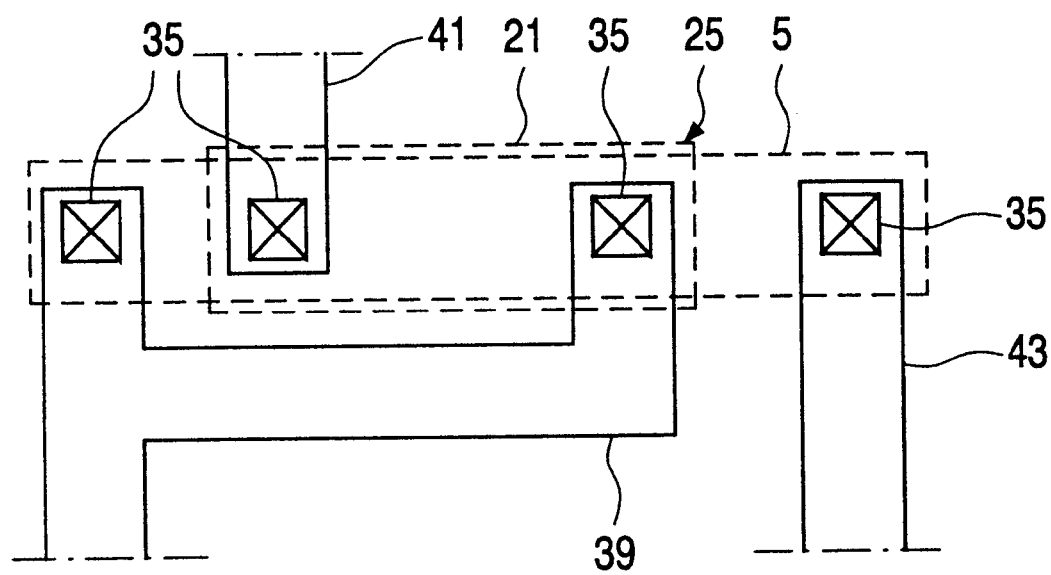
FIG. 4 is a top view of the transistor structure of FIG. 3.

A further oxide layer 33 is then formed on the surface from tetra-ethyl-ortho-silicate (TEOS, also known as tetra-ethoxy silane), as is known. A plurality of contact vias 35 is formed in the TEOS oxide layer 33. A metallisation layer 37 is deposited on the TEOS layer, to form source 39, gate 41 and drain 43 connections. The source connection 39 extends to connect to both the source diffusion 9 and the field plate 25, as shown in FIG. 4. As can be seen, the connection in the region of the source diffusion connects to the high doping density body region 36 also. A rear contact 45 is provided on the backside of the substrate 1 to allow the substrate to be biased.

The diodes act as protection diodes which are particularly suitable for protection against electrostatic discharge (ESD).

As in the structure of the embodiment of FIG. 2, the source connected field plate reduces the gate-drain capacitance $C_{gd}$. This reduction is over and above the inherently low capacitance delivered by a silicon on insulator structure. Thus, the switching time of the device is reduced.

Furthermore, the gate is protected from over-voltage and electrostatic discharge by the protection diodes formed between the gate electrode 23 and the field plate 25 by the p-n junctions 26 in the semiconductor layer 21.

The structure thus conveniently provides both good switching time and electrostatic discharge protection without adding significantly to the manufacturing complexity.

The device can act as a RESURF structure in which the drift region 13 is wholly depleted when the device is turned off. The depletion region in the drift region 13 can extend into the drain region 11 and the low-doped body region 34. Voltage may be uniformly dropped across the depleted drift region allowing higher voltages to be present between source and drain before breakdown occurs. By allowing the drift region 13 to be depleted from both sides rather than just from the field plate 25 or the substrate 1 the doping of the drift region may be higher than would otherwise be compatible with completely depleting the drift region when the device is turned off. This in turn can decrease the on-resistance.

The structure requires only a single polysilicon layer above the gate oxide and the LOCOS oxide which eases manufacture. The separation between field plate and gate electrode is simply defined by the p and n strips, i.e. by the diffusions.

To minimise any increase in $C_{gs}$ caused by the depletion regions at the p-n junctions the p-type strips may be lightly doped at or near the junction. Alternatively or additionally, the n-type strips may be lightly doped instead.

The p+region 36 near the source may improve the ruggedness of the structure. Further, it can act as an ohmic contact.

The invention is not limited to the embodiments described, and the skilled person will relatively conceive of alternatives, a few of which will be presented below, purely by way of example.

The regions with p and n type doping may be switched around round.

In alternate embodiments of the invention, the field plate 21 may have the opposite polarity to the gate electrode 23 and the number of diodes of each polarity may be different.

The gate insulation and field plate insulation need not be of oxide, but may be of other suitable materials, such as nitride.

The semiconductor used is not restricted to silicon, but may also be Gallium Arsenide, or any other suitable semiconductor.

Although the examples show a number of alternating p and n regions 27, 29 between the field plate and the gate electrode, there may be more regions. Alternatively, there may be fewer regions. For example a single p region formed between an n-type gate electrode and an n-type field plate will provide a single pair of back to back p-n junctions.

Any suitable insulating layer may be used instead of the TEOS layers.

What is claimed is:

1. A field effect transistor comprising:

a source and a drain laterally spaced in a body semiconductor layer;

a channel and a drift region in the body semiconductor layer between the source and the drain;

an oxide layer over the channel and the drift region;

an upper semiconductor layer arranged over the oxide layer, wherein the upper semiconductor layer is doped to have a gate region arranged over the channel but not over the source, a field plate region arranged over the drift region and at least one p-n junction forming at least one diode between the field plate region and the gate region; and an electrical interconnection between the source region and the field plate region to electrically connect the source region and the field plate region.

2. A transistor according to claim 1 further comprising a substrate and a buried oxide layer over the substrate and under the body semiconductor layer.

3. A transistor according to claim 1 wherein the upper semiconductor layer is doped to have alternating p and n regions forming a plurality of back to back diodes.

4. A transistor according to claim 1 wherein the oxide layer includes a LOCOS layer above the drift region and a thinner oxide layer above the channel to act as the gate oxide.

5. A transistor according to claim 1 wherein the drift region has a laterally varying dopant concentration, with a higher dopant concentration adjacent to the drain region and a lower dopant concentration adjacent to the channel.

6. An insulated gate field effect transistor according to claim 1 wherein the doping concentration and the thickness of the drift region are such that the drift region is depleted throughout its thickness and along its length when the transistor is turned off.

* * * * *